US012809477B2

(12) United States Patent
Kim et al.

(10) Patent No.: US 12,809,477 B2
(45) Date of Patent: Nov. 24, 2026

(54) INPUT SENSING PART INCLUDING MUX CIRCUITS CONNECTED TO SENSING PADS AND SENSING LINES, AND DISPLAY DEVICE INCLUDING THE SAME

(71) Applicant: Samsung Display Co., Ltd., Yongin-si (KR)

(72) Inventors: Kicheol Kim, Yongin-si (KR); Gyeongnam Bang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/915,146

(22) Filed: Oct. 14, 2024

(65) Prior Publication Data

US 2025/0306700 A1 Oct. 2, 2025

(30) Foreign Application Priority Data

Mar. 26, 2024 (KR) ........................ 10-2024-0041062

(51) Int. Cl.
*G06F 3/041* (2006.01)
*G06F 3/044* (2006.01)
*H10K 59/40* (2023.01)

(52) U.S. Cl.
CPC ........ *G06F 3/04164* (2019.05); *G06F 3/0446* (2019.05); *H10K 59/40* (2023.02); *G06F 2203/04107* (2013.01)

(58) Field of Classification Search
None
See application file for complete search history.

(56) References Cited

U.S. PATENT DOCUMENTS

| | | | | |
|---|---|---|---|---|
| 10,978,447 | B2 | 4/2021 | Kim et al. | |
| 11,615,719 | B2 | 3/2023 | Du et al. | |
| 2007/0013834 | A1* | 1/2007 | Kim | H01J 11/44 349/110 |
| 2012/0074961 | A1* | 3/2012 | Herrmann | G06F 3/044 324/658 |
| 2012/0182233 | A1* | 7/2012 | Kim | G06F 3/0446 345/173 |
| 2016/0062499 | A1* | 3/2016 | Pedder | G06F 3/041 345/174 |
| 2017/0003792 | A1* | 1/2017 | Berget | G06F 3/04166 |

(Continued)

FOREIGN PATENT DOCUMENTS

| | | | | |
|---|---|---|---|---|
| CN | 110162219 | A * | 8/2019 | G06F 3/045 |
| CN | 112436047 | A | 3/2021 | |

(Continued)

OTHER PUBLICATIONS

Chung, et al., High-performance transparent electromagnetic interference shielding film based on metal meshes, Feb. 3, 2023, Journal of Micromechanics and Microengineering, 33 035002, p. 2. (Year: 2023).*

*Primary Examiner* — Kirk W Hermann
(74) *Attorney, Agent, or Firm* — Womble Bond Dickinson (US) LLP

(57) ABSTRACT

An input-sensing part including sensing electrodes, sensing lines connected to the sensing electrodes, MUX circuits connected to the sensing lines, sensing pads connected to the MUX circuits, the sensing pads being fewer in number than the sensing lines, and a shielding electrode above the MUX circuits to cover the MUX circuits.

20 Claims, 16 Drawing Sheets

(56) References Cited

U.S. PATENT DOCUMENTS

| | | | | |
|---|---|---|---|---|
| 2018/0261147 | A1* | 9/2018 | Lin | G06F 3/0412 |
| 2018/0284926 | A1* | 10/2018 | Kim | G06F 3/04164 |
| 2019/0304921 | A1* | 10/2019 | Kuroe | G02F 1/1333 |
| 2020/0403597 | A1* | 12/2020 | Takeuchi | H03H 7/463 |
| 2022/0357624 | A1 | 11/2022 | Saitoh et al. | |
| 2022/0384557 | A1* | 12/2022 | Wang | H04M 1/0269 |
| 2023/0120673 | A1 | 4/2023 | Bok et al. | |
| 2023/0131983 | A1 | 4/2023 | Park et al. | |

FOREIGN PATENT DOCUMENTS

| | | | |
|---|---|---|---|
| JP | 2021-113960 | A | 8/2021 |
| KR | 10-2019-0027993 | A | 3/2019 |
| KR | 10-2552266 | B1 | 7/2023 |

* cited by examiner

INPUT SENSING PART INCLUDING MUX CIRCUITS CONNECTED TO SENSING PADS AND SENSING LINES, AND DISPLAY DEVICE INCLUDING THE SAME

CROSS-REFERENCE TO RELATED APPLICATION

The present application claims priority to, and the benefit of, Korean Patent Application No. 10-2024-0041062, filed on Mar. 26, 2024, in the Korean Intellectual Property Office, the entire disclosure of which is incorporated herein by reference.

BACKGROUND

1. Field

Embodiments of the present disclosure described herein relate to an input-sensing part and a display device including the same.

2. Description of the Related Art

In general, electronic devices, such as smart phones, digital cameras, notebook computers, car navigation units, smart televisions, and the like, which provide an image to a user, include a display device for displaying an image. The display device generates an image, and provides the generated image to the user through a display screen. The display device includes a display panel for generating an image, and an input device, such as an input-sensing part.

The input-sensing part is located on the display panel, and senses a touch of the user as an external input. The input-sensing part driven in a self-sensing mode includes a plurality of sensing electrodes, and a plurality of sensing lines connected to the sensing electrodes, respectively. The sensing lines are connected to pads.

Multiplexer (MUX) circuits connecting the sensing lines to the pads may be used to reduce the number of pads. The MUX circuits may be vulnerable to external static electricity, and therefore may be damaged by the external static electricity. Accordingly, a technology for protecting the MUX circuits is suitable.

SUMMARY

Embodiments of the present disclosure provide an input-sensing part for protecting MUX circuits connected to sensing lines and pads, and a display device including the input-sensing part.

According to one or more embodiments, an input-sensing part includes sensing electrodes, sensing lines connected to the sensing electrodes, MUX circuits connected to the sensing lines, sensing pads connected to the MUX circuits, the sensing pads being fewer in number than the sensing lines, and a shielding electrode above the MUX circuits to cover the MUX circuits.

The shielding electrode may be at a same layer as the sensing lines.

The shielding electrode may be at a same layer as the sensing electrodes.

The sensing electrodes, the sensing lines, and the shielding electrode may be at a same layer.

The MUX circuits may be below the sensing electrodes, the sensing lines, and the shielding electrode.

The input-sensing part may further include a ground pad connected to the shielding electrode.

The shielding electrode may be configured to shield the MUX circuits from an external static electricity.

The shielding electrode may include a one-body shape to cover all of the MUX circuits.

The sensing electrodes may be arranged in a first direction, and in a second direction crossing the first direction, wherein the MUX circuits are arranged in the first direction, and wherein an h-th MUX circuit connects ones of the sensing lines connected to ones of the sensing electrodes in an h-th column to an h-th one of the sensing pads, h being a natural number.

A length of the shielding electrode may be greater in the first direction than in the second direction.

The h-th MUX circuit may include switching elements connected to the ones of the sensing lines connected to the ones of the sensing electrodes in the h-th column, respectively, the switching elements being commonly connected to the h-th one of the sensing pads, and being configured to be turned on at different respective timings by control signals.

The shielding electrode may be above the switching elements to cover the switching elements.

The shielding electrode may include a first sub-shielding electrode, and a second sub-shielding electrode spaced apart from the first sub-shielding electrode in the second direction.

The shielding electrode may include a first sub-shielding electrode, and a second sub-shielding electrode spaced apart from the first sub-shielding electrode in the first direction.

The shielding electrode may have a mesh shape.

The shielding electrode may include a first shielding electrode, and a second shielding electrode above the first shielding electrode.

The sensing electrodes may be above the sensing lines, wherein the first shielding electrode is at a same layer as the sensing lines, and wherein the second shielding electrode is at a same layer as the sensing electrodes.

According to one or more embodiments, a display device includes a display panel including light-emitting elements, and transistors connected to the light-emitting elements, and an input-sensing part above the display panel, the input-sensing part including sensing electrodes, sensing lines connected to the sensing electrodes, MUX circuits connected to the sensing lines, and including switching elements at a same layer as the transistors, sensing pads connected to the MUX circuits, the sensing pads being fewer in number than the sensing lines, and a shielding electrode above the MUX circuits to cover the MUX circuits.

The MUX circuits may be inside the display panel.

The shielding electrode may be at a same layer as the sensing electrodes or as the sensing lines.

BRIEF DESCRIPTION OF THE DRAWINGS

The above and other aspects of the present disclosure will become apparent by describing in detail embodiments thereof with reference to the accompanying drawings.

DETAILED DESCRIPTION

Figure 1:
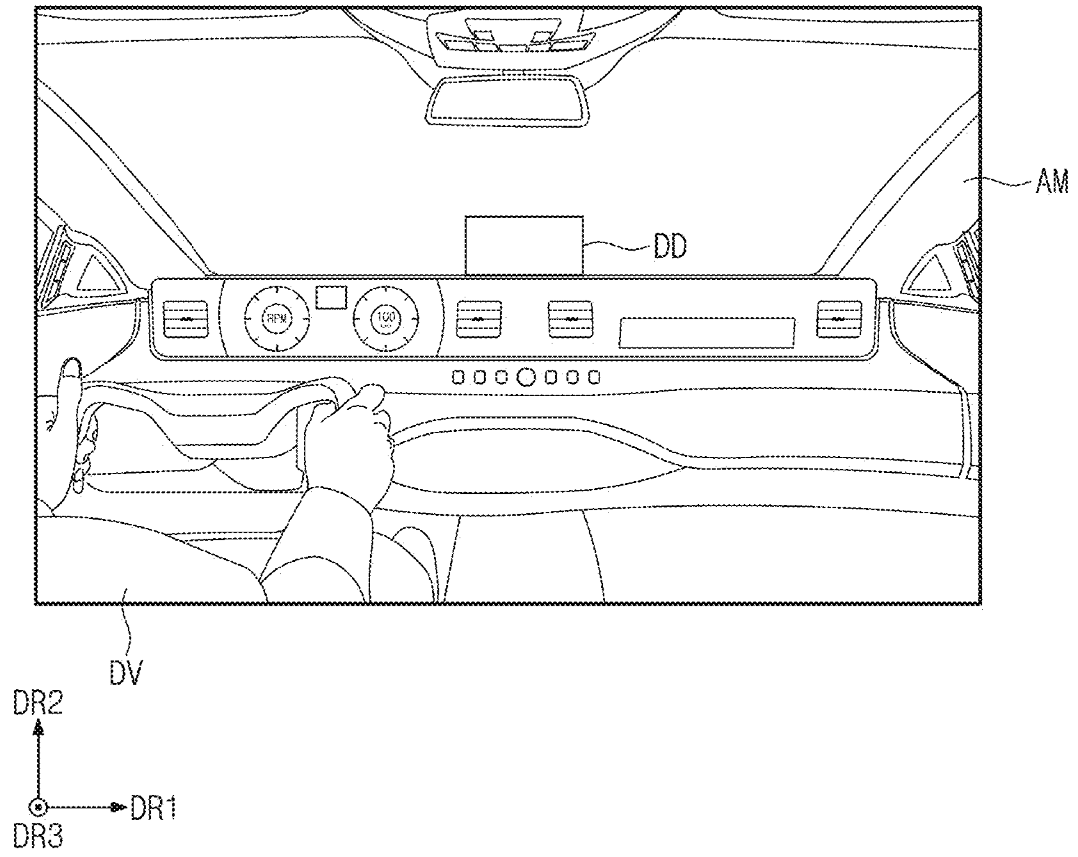
FIG. 1 is a view illustrating the interior of a vehicle in which a display device according to one or more embodiments of the present disclosure is located.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure.

A person of ordinary skill in the art would appreciate, in view of the present disclosure in its entirety, that the present disclosure covers all modifications, equivalents, and replacements within the idea and technical scope of the present disclosure, that each of the features of embodiments of the present disclosure may be combined with each other, in part or in whole, and technically various interlocking and operating are possible, and that each embodiment may be implemented independently of each other, or may be implemented together in an association, unless otherwise stated or implied.

In the drawings, the relative sizes of elements, layers, and regions may be exaggerated for clarity and/or descriptive purposes. In other words, because the sizes and thicknesses of elements in the drawings are arbitrarily illustrated for convenience of description, the disclosure is not limited thereto. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as "beneath," "below," "lower," "lower side," "under," "above," "upper," "over," "higher," "upper side," "side" (e.g., as in "sidewall"), and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a resistor, a capacitor, and/or the like. In describing embodiments, an expression of connection indicates electrical connection unless explicitly described to be direct connection, and "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to," may be construed similarly. It will be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expressions "at least one of A and B" and "at least one of A or B" may include A, B, or A and B. As used herein, "or" generally means "and/or," and the term "and/or" includes any and all combinations of one or more of the associated listed items. For example, the expression "A and/or B" may include A, B, or A and B. Similarly, expressions such as "at least one of," "a plurality of," "one of," and other prepositional phrases, when preceding a list of elements, modify the entire list of elements and do not modify the individual elements of the list. When "C to D" is stated, it means C or more and D or less, unless otherwise specified.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the terms "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of +/−5% of a corresponding value. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

In some embodiments well-known structures and devices may be described in the accompanying drawings in relation to one or more functional blocks (e.g., block diagrams), units, and/or modules to avoid unnecessarily obscuring various embodiments. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
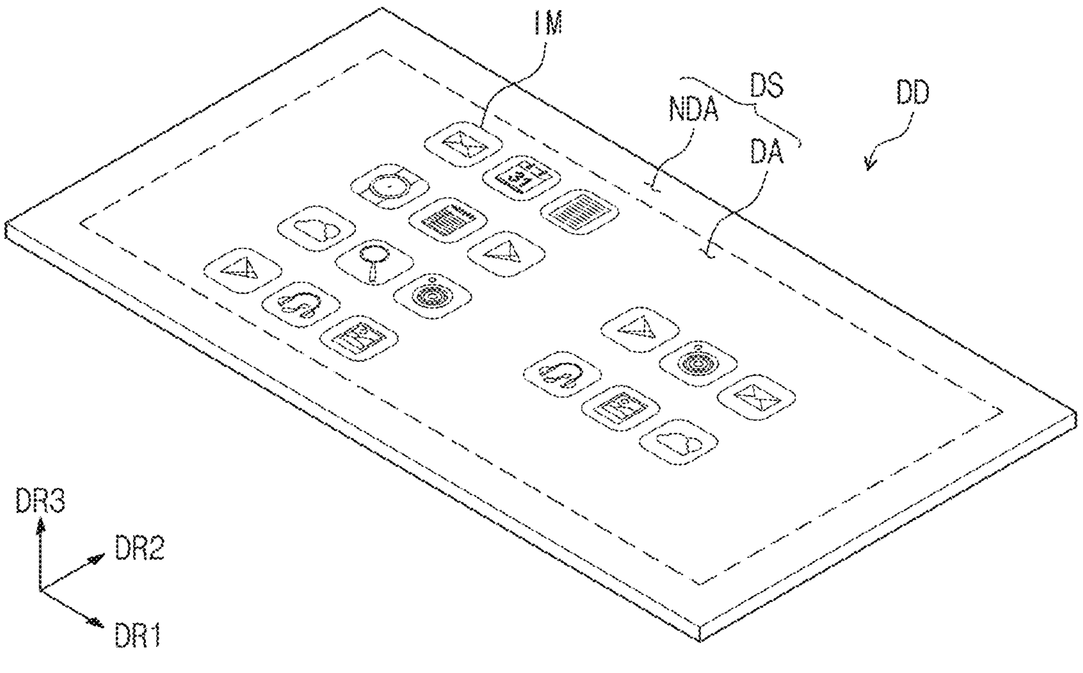
FIG. 2 is a perspective view of the display device illustrated in FIG. 1.

FIG. 1 is a view illustrating the interior of a vehicle in which a display device according to one or more embodiments of the present disclosure is located. FIG. 2 is a perspective view of the display device illustrated in FIG. 1.

Referring to FIG. 1, the display device DD may be located inside the vehicle AM. The display device DD located inside the vehicle AM may provide various pieces of information to a driver DV (e.g., a user). The display device DD may provide weather, speed, a map, or an image, such as a movie to the driver DV. The display device DD may be a touch display that operates in response to a touch input of the driver DV.

Referring to FIGS. 1 and 2, the display device DD may have a plane defined by a first direction DR1 and a second direction DR2 crossing each other. The display device DD may have a rectangular shape with long sides extending in the first direction DR1, and short sides extending in the second direction DR2. However, without being limited thereto, the display device DD may have various shapes, such as a circular shape, a polygonal shape, and the like.

Hereinafter, a direction substantially perpendicular to the plane defined by the first direction DR1 and the second direction DR2 is defined as a third direction DR3. The expression "when viewed from above the plane" used herein may mean that it is viewed in the third direction DR3.

The upper surface of the display device DD may be defined as a display surface DS, and may have a plane defined by the first direction DR1 and the second direction DR2. Images IM generated by the display device DD may be provided to the user through the display surface DS.

The display surface DS may include a display area DA, and a non-display area NDA around the display area DA. The display area DA may display an image, and the non-display area NDA may not display an image. The non-display area NDA may surround the display area DA (e.g., in plan view), and may define the border of the display device DD that is printed in a corresponding color.

Although the display device DD for the vehicle AM is illustrated as an example, embodiments of the present disclosure are not limited thereto. For example, the display device DD according to one or more embodiments of the present disclosure may be used in electronic devices, such as a smart phone, a digital camera, a notebook computer, a monitor, and a smart television, which provide an image to the user.

Figure 3:
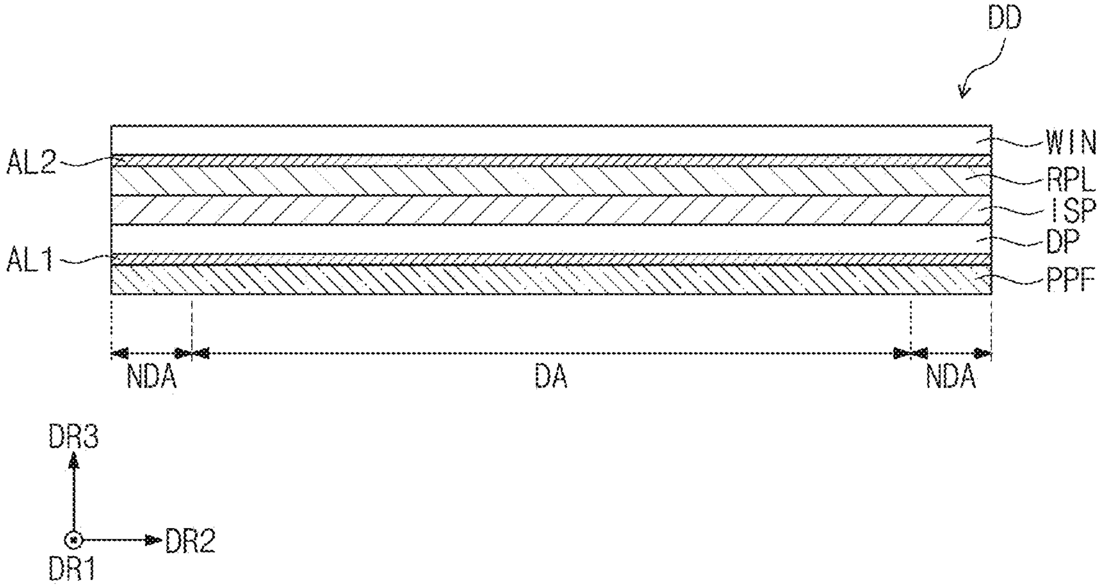
FIG. 3 is a sectional view of the display device illustrated in FIG. 2.

FIG. 3 is a sectional view of the display device illustrated in FIG. 2.

In FIG. 3, a section of the display device DD viewed in the first direction DR1 is illustrated.

Referring to FIG. 3, the display device DD may include a display panel DP, an input-sensing part ISP, an anti-reflective layer RPL, a window WIN, a panel protection film PPF, and first and second adhesive layers AL1 and AL2.

The display panel DP according to one or more embodiments of the present disclosure may be an emissive display panel. For example, the display panel DP may be an organic light-emitting display panel or an inorganic light-emitting display panel. An emissive layer of the organic light-emitting display panel may include an organic luminescent material. An emissive layer of the inorganic light-emitting display panel may include quantum dots, quantum rods, and the like. Hereinafter, it will be exemplified that the display panel DP is an organic light-emitting display panel.

The input-sensing part ISP may be located on the display panel DP. In one or more embodiments, the input-sensing part ISP may include a plurality of sensing parts for sensing an external input in a capacitive type. The input-sensing part ISP may be directly manufactured on the display panel DP when the display device DD is manufactured. However, without being limited thereto, the input-sensing part ISP may be manufactured as a panel separate from the display panel DP, and may be attached to the display panel DP by an adhesive layer.

The anti-reflective layer RPL may be located on the input-sensing part ISP. The anti-reflective layer RPL may be directly manufactured on the input-sensing part ISP when the display device DD is manufactured. However, without being limited thereto, the anti-reflective layer RPL may be manufactured as a separate panel and may be attached to the input-sensing part ISP by an adhesive layer.

The anti-reflective layer RPL may be defined as a film for reducing or preventing reflection of external light. The anti-reflective layer RPL may decrease the reflectance of external light incident toward the display panel DP from above the display device DD. The external light may not be visible to the user due to the anti-reflective layer RPL.

When external light travelling toward the display panel DP is reflected from the display panel DP and provided back to the user, the user may visually recognize the external light as in a mirror. To reduce or prevent the likelihood of such a phenomenon, the anti-reflective layer RPL may include a plurality of color filters that display the same colors as those of pixels of the display panel DP.

The color filters may filter the external light into the same colors as those of the pixels. In this case, the external light may not be visible to the user. However, without being limited thereto, the anti-reflective layer RPL may include a phase retarder and/or a polarizer to decrease the reflectance of the external light.

The window WIN may be located on the anti-reflective layer RPL. The window WIN may protect the display panel DP, the input-sensing part ISP, and the anti-reflective layer RPL from external scratches and impacts.

The panel protection film PPF may be located under the display panel DP. The panel protection film PPF may protect a lower portion of the display panel DP. The panel protection film PPF may include a flexible plastic material, such as polyethylene terephthalate (PET).

The first adhesive layer AL1 may be located between the display panel DP and the panel protection film PPF, and the display panel DP and the panel protection film PPF may be bonded to each other by the first adhesive layer AL1. The second adhesive layer AL2 may be located between the window WIN and the anti-reflective layer RPL, and the window WIN and the anti-reflective layer RPL may be bonded to each other by the second adhesive layer AL2.

Figure 4:
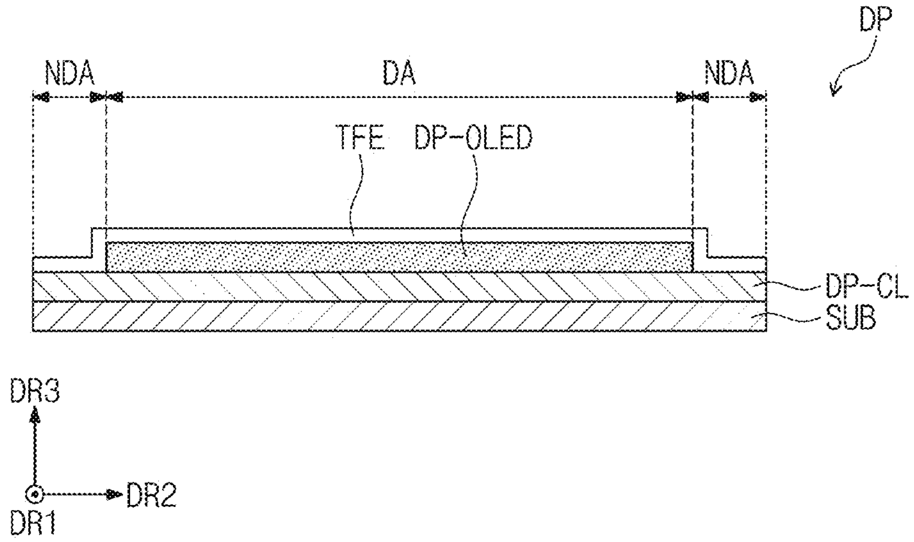
FIG. 4 is a sectional view of a display panel illustrated in FIG. 3.

FIG. 4 is a sectional view of the display panel illustrated in FIG. 3. In FIG. 4, a section in which the display panel DP viewed in the first direction DR1 is illustrated.

Referring to FIG. 4, the display panel DP may include a substrate SUB, a circuit element layer DP-CL located on the substrate SUB, a display element layer DP-OLED located on the circuit element layer DP-CL, and a thin film encapsulation layer TFE located on the display element layer DP-OLED.

The substrate SUB may include a display area DA, and a non-display area NDA around the display area DA. The substrate SUB may include glass or may include a flexible plastic material, such as polyimide (PI). The display element layer DP-OLED may be located on the display area DA.

A plurality of pixels may be located in the circuit element layer DP-CL and the display element layer DP-OLED. Each of the pixels may include transistors located in the circuit element layer DP-CL, and a light-emitting element located in the display element layer DP-OLED and connected to the transistors.

The thin film encapsulation layer TFE may be located on the circuit element layer DP-CL to cover the display element layer DP-OLED. The thin film encapsulation layer TFE may protect the pixels from moisture, oxygen, and external foreign matter.

Figure 5:
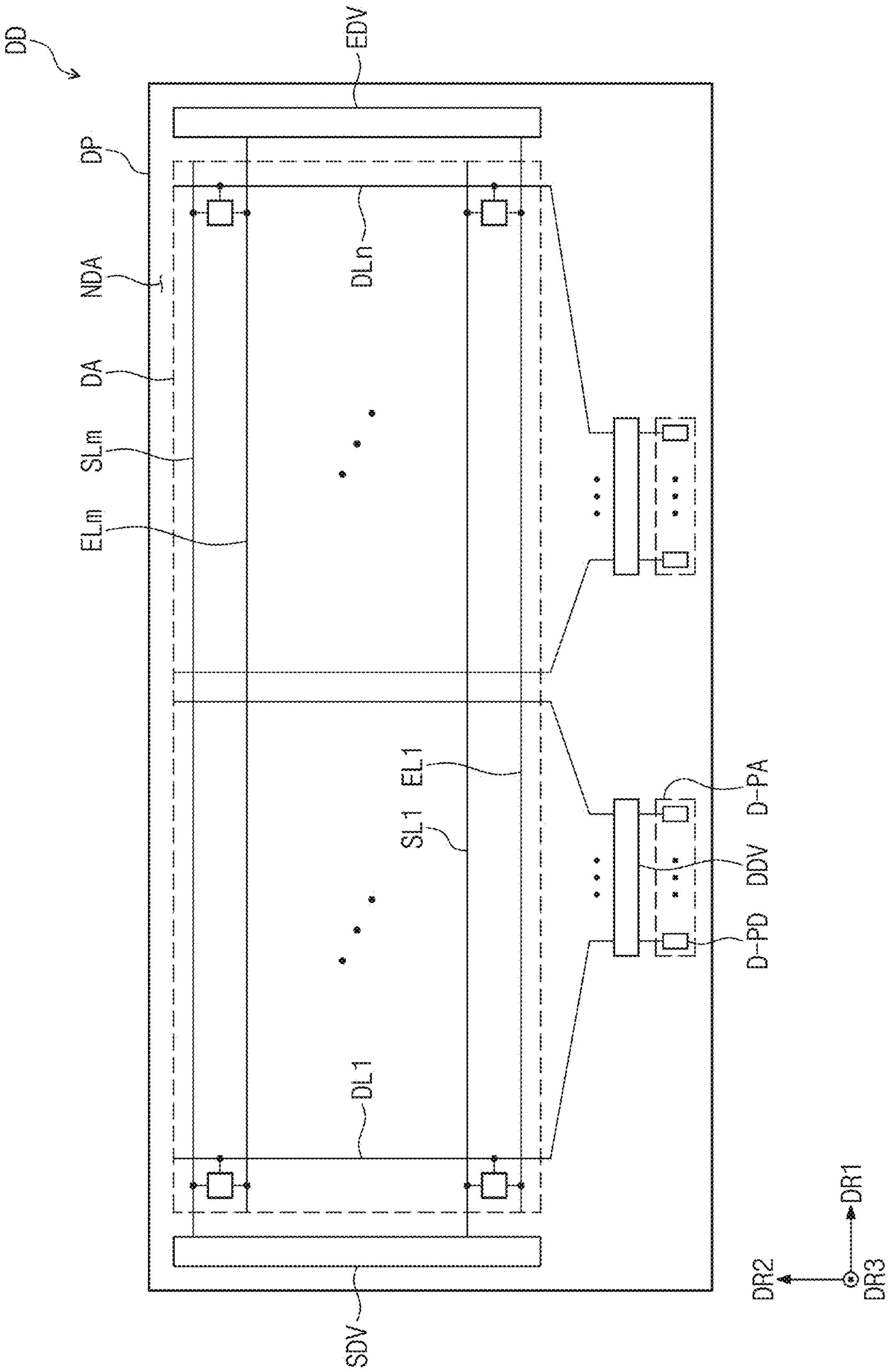
FIG. 5 is a plan view of the display panel illustrated in FIG. 3.

FIG. 5 is a plan view of the display panel illustrated in FIG. 3.

Referring to FIG. 5, the display device DD may include the display panel DP, a scan driver SDV, a plurality of data drivers DDV, a light emission driver EDV, and a plurality of pads D-PD.

The display panel DP may have a rectangular shape with long sides extending in the first direction DR1, and short sides extending in the second direction DR2. However, the shape of the display panel DP is not limited thereto. The display panel DP may include a display area DA, and a non-display area NDA surrounding the display area DA.

The display panel DP may include a plurality of pixels PX, a plurality of scan lines SL1 to SLm, a plurality of data lines DL1 to DLn, and a plurality of light emission lines EL1 to ELm. Here, “m” and “n” are natural numbers.

The pixels PX may be located in the display area DA. The scan driver SDV and the light emission driver EDV may be located in the non-display areas NDA adjacent to opposite sides of the display panel DP that face away from each other in the first direction DR1. The data drivers DDV may be located in the non-display area NDA adjacent to one of opposite sides of the display panel DP that face away from each other in the second direction DR2. The data drivers DDV may be adjacent to the lower end of the display panel DP when viewed from above the plane.

The scan lines SL1 to SLm may extend in the first direction DR1, and may be connected to the pixels PX and the scan driver SDV. The data lines DL1 to DLn may extend in the second direction DR2, and may be connected to the pixels PX and the data drivers DDV. The light emission lines EL1 to ELm may extend in the first direction DR1, and may be connected to the pixels PX and the light emission driver EDV.

The data drivers DDV may be spaced apart from each other in the first direction DR1. A corresponding number of data lines may be connected to each of the data drivers DDV. Although two data drivers DDV are illustrated as an example, the number of data drivers DDV is not limited thereto. For example, as the left and right areas of the display panel DP are increased, the number of data drivers DDV may also be increased.

The pads D-PD may be located in the non-display area NDA adjacent to the lower end of the display panel DP, and may be closer to the lower end of the display panel DP than the data drivers DDV. The data drivers DDV may be connected to the pads D-PD. The data lines DL1 to DLn may be connected to the data drivers DDV, and the data drivers DDV may be connected to the pads D-PD corresponding to the data lines DL1 to DLn.

A plurality of pad areas D-PA corresponding to the data drivers DDV, respectively, may be defined in the display panel DP. The pad areas D-PA may be closer to the lower end of the display panel DP than the data drivers DDV. The pad areas D-PA may be spaced apart from each other in the first direction DR1, and may be adjacent to the data drivers DDV, respectively, in the second direction DR2. A corresponding number of pads D-PD may be located in each of the pad areas D-PA.

Although not illustrated, the display device DD may further include a timing controller for controlling operations of the scan driver SDV, the data drivers DDV, and the light emission driver EDV. The timing controller may be connected to the pads D-PD through a printed circuit board.

The scan driver SDV may generate a plurality of scan signals, and the scan signals may be applied to the pixels PX through the scan lines SL1 to SLm. The data drivers DDV may generate a plurality of data voltages, and the data voltages may be applied to the pixels PX through the data lines DL1 to DLn. The light emission driver EDV may generate a plurality of light emission signals, and the light emission signals may be applied to the pixels PX through the light emission lines EL1 to ELm.

The pixels PX may receive the data voltages in response to the scan signals. The pixels PX may display an image by emitting light having luminance corresponding to the data voltages in response to the light emission signals.

Figure 6:
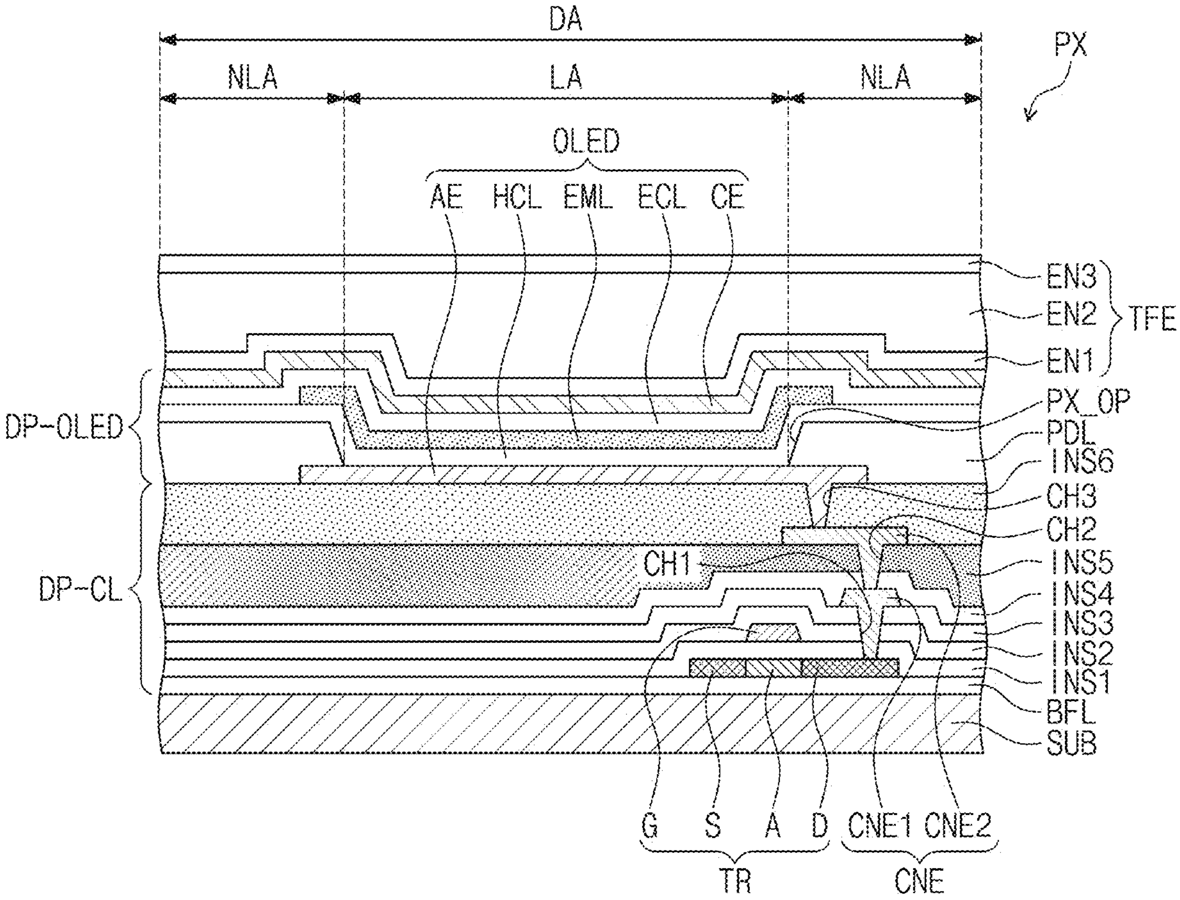
FIG. 6 is a sectional view of one pixel illustrated in FIG. 5.

FIG. 6 is a sectional view of one pixel illustrated in FIG. 5.

Referring to FIG. 6, the pixel PX may include a transistor TR and a light-emitting element OLED. The light-emitting element OLED may include a first electrode AE (e.g., an anode), a second electrode CE (e.g., a cathode), a hole control layer HCL, an electron control layer ECL, and an emissive layer EML.

The transistor TR and the light-emitting element OLED may be located on the substrate SUB. Although one transistor TR is illustrated as an example, the pixel PX may substantially include a plurality of transistors, and at least one capacitor for driving the light-emitting element OLED.

The display area DA may include an emissive area LA corresponding to each of the pixels PX, and a non-emissive area NLA around the emissive area LA. The light-emitting element OLED may be located in the emissive area LA.

A buffer layer BFL may be located on the substrate SUB. The buffer layer BFL may be an inorganic layer. A semiconductor pattern may be located on the buffer layer BFL. The semiconductor pattern may include poly silicon, amorphous silicon, or metal oxide.

The semiconductor pattern may be doped with an N-type dopant or a P-type dopant. The semiconductor pattern may include highly-doped areas and a lightly-doped area. The highly-doped areas may have a higher conductivity than the lightly-doped area, and may substantially serve as a source electrode and a drain electrode of the transistor TR. The lightly-doped area may substantially correspond to an active (e.g., channel) area of the transistor TR.

The source S, the active area A, and the drain D of the transistor TR may be formed from the semiconductor pattern. A first insulating layer INS1 may be located on the semiconductor pattern. A gate G of the transistor TR may be located on the first insulating layer INS1. A second insulating layer INS2 may be located on the gate G. A third insulating layer INS3 may be located on the second insulating layer INS2.

To connect the transistor TR and the light-emitting element OLED, a connecting electrode CNE may include a first connecting electrode CNE1 and a second connecting electrode CNE2. The first connecting electrode CNE1 may be located on the third insulating layer INS3, and may be connected to the drain D through a first contact hole CH1 defined in the first to third insulating layers INS1 to INS3.

A fourth insulating layer INS4 may be located on the first connecting electrode CNE1. A fifth insulating layer INS5 may be located on the fourth insulating layer INS4. The second connecting electrode CNE2 may be located on the fifth insulating layer INS5. The second connecting electrode CNE2 may be connected to the first connecting electrode CNE1 through a second contact hole CH2 defined in the fourth and fifth insulating layers INS4 and INS5.

A sixth insulating layer INS6 may be located on the second connecting electrode CNE2. The layers from the buffer layer BFL to the sixth insulating layer INS6 may be defined as the circuit element layer DP-CL. The first to sixth insulating layers INS1 to INS6 may be inorganic layers or organic layers.

The first electrode AE may be located on the sixth insulating layer INS6. The first electrode AE may be connected to the second connecting electrode CNE2 through a third contact hole CH3 defined in the sixth insulating layer INS6. A pixel-defining layer PDL, which defines an opening PX_OP therein to expose a corresponding portion of the first electrode AE, may be located on the first electrode AE and the sixth insulating layer INS6.

The hole control layer HCL may be located on the first electrode AE and the pixel-defining layer PDL. The hole control layer HCL may include a hole transport layer and a hole injection layer.

The emissive layer EML may be located on the hole control layer HCL. The emissive layer EML may be located in an area corresponding to the opening PX_OP. The emissive layer EML may include an organic material and/or an inorganic material. The emissive layer EML may generate one of red light, green light, or blue light.

The electron control layer ECL may be located on the emissive layer EML and the hole control layer HCL. The electron control layer ECL may include an electron transport layer and an electron injection layer. The hole control layer HCL and the electron control layer ECL may be commonly located in the emissive area LA and the non-emissive area NLA.

The second electrode CE may be located on the electron control layer ECL. The second electrode CE may be commonly located for the pixels PX. The layer in which the light-emitting element OLED is located may be defined as the display element layer DP-OLED.

The thin film encapsulation layer TFE may be located on the second electrode CE and may cover the pixel PX. The thin film encapsulation layer TFE may include a first encapsulation layer EN1 located on the second electrode CE, a second encapsulation layer EN2 located on the first encapsulation layer EN1, and a third encapsulation layer EN3 located on the second encapsulation layer EN2.

The first and third encapsulation layers EN1 and EN3 may include an inorganic insulating layer, and may protect the pixel PX from moisture/oxygen. The second encapsulation layer EN2 may include an organic insulating layer and may protect the pixel PX from foreign matter, such as dust particles.

A first voltage may be applied to the first electrode AE through the transistor TR, and a second voltage having a lower level than the first voltage may be applied to the second electrode CE. Holes and electrons injected into the emissive layer EML may be combined to form excitons, and as the excitons transition to a ground state, the light-emitting element OLED may emit light.

Figure 7:
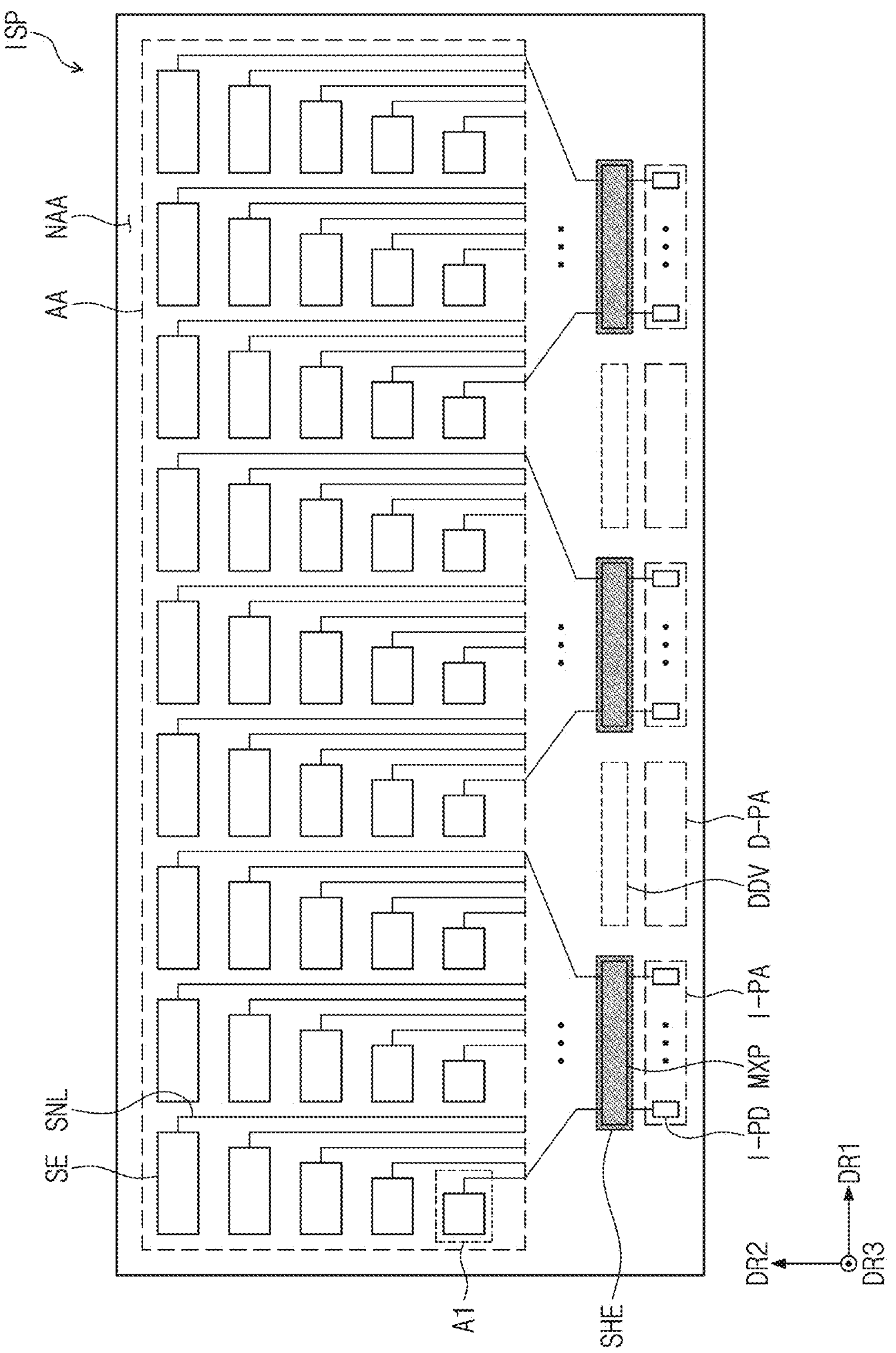
FIG. 7 is a plan view of an input-sensing part illustrated in FIG. 3.

FIG. 7 is a plan view of the input-sensing part illustrated in FIG. 3.

In FIG. 7, the data drivers DDV and the pad areas D-PA described above are illustrated together with the input-sensing part ISP. In FIG. 7, the data drivers DDV and the pad areas D-PA are illustrated by dotted lines.

Referring to FIG. 7, the input-sensing part ISP may include a plurality of sensing electrodes SE, a plurality of sensing lines SNL, a plurality of multiplexer (MUX) circuits (e.g., MUX units) MXP, a plurality of pads I-PD, and a plurality of shielding electrodes SHE. The sensing electrodes SE and the sensing lines SNL may be located on the thin film encapsulation layer TFE. Elements of the MUX circuits MXP may be located inside the display panel DP, and this stacked structure will be described below with reference to FIG. 11.

The input-sensing part ISP may include an active area AA and a non-active area NAA surrounding the active area AA. The active area AA may overlap the display area DA, and the non-active area NAA may overlap the non-display area NDA.

The sensing electrodes SE may be located in the active area AA. The sensing electrodes SE may be arranged in the first direction DR1 and the second direction DR2. For example, the sensing electrodes SE may have a quadrangular shape. However, the shape of the sensing electrodes SE is not limited thereto. Hereinafter, columns correspond to the second direction DR2. The widths of the sensing electrodes SE in the first direction DR1 in the h-th column may be sequentially decreased from top to bottom. Here, "h" is a natural number.

Each of the sensing electrodes SE may have unique coordinate information. For example, the sensing electrodes SE may be arranged in a matrix form, and may be connected to the sensing lines SNL, respectively. However, without being limited thereto, the sensing electrodes SE may be arranged in various forms.

The sensing lines SNL may be connected to the sensing electrodes SE, respectively, and may extend to the non-active area NAA. Each of the sensing lines SNL may be connected to one of opposite sides of a corresponding sensing electrode SE that face away from each other in the first direction DR1.

The sensing lines SNL connected to the sensing electrodes SE arranged in the h-th column may be located between the sensing electrodes SE arranged in the h-th column and the sensing electrodes SE arranged in the (h+1)th column. The sensing lines SNL connected to the sensing electrodes SE arranged in the last column (e.g., the rightmost column in FIG. 7) may be adjacent to one side of the active area AA (e.g., the right side of the active area AA in FIG. 7).

The MUX circuits MXP may be located in the non-active area NAA adjacent to the lower end of the input-sensing part ISP. The MUX circuits MXP may be arranged in the first direction DR1. The data drivers DDV may be located between the MUX circuits MXP when viewed from above the plane. That is, the MUX circuits MXP and the data drivers DDV may not overlap each other when viewed from above the plane.

The sensing lines SNL may extend to the non-active area NAA adjacent to the lower end of the input-sensing part ISP. The sensing lines SNL may be connected to the MUX circuits MXP. A corresponding number of sensing lines SNL may be connected to each of the MUX circuits MXP. For example, the sensing lines SNL connected to the sensing electrodes SE arranged in a corresponding number of columns may be connected to each of the MUX circuits MXP.

Although three MUX circuits MXP are illustrated as an example, the number of MUX circuits MXP is not limited thereto. For example, as the left and right areas of the input-sensing part ISP are increased, the number of MUX circuits MXP may also be increased.

The pads I-PD may be located in the non-active area NAA adjacent to the lower end of the input-sensing part ISP, and may be closer to the lower end of the input-sensing part ISP than the MUX circuits MXP. The MUX circuits MXP may be connected to the pads I-PD. The number of pads I-PD may be less than the number of sensing lines SNL. The MUX circuits MXP may selectively connect some of the pads I-PD to the sensing lines SNL. This configuration will be described below in detail with reference to FIG. 10.

A plurality of pad areas I-PA corresponding to the MUX circuits MXP, respectively, may be defined in the input-sensing part ISP. The pad areas I-PA may be closer to the lower end of the input-sensing part ISP than the MUX circuits MXP. The pad areas I-PA may be arranged in the first direction DR1, and may be adjacent to the MUX circuits MXP, respectively, in the second direction DR2. A corresponding number of pads I-PD may be located in each of the pad areas I-PA.

The pad areas D-PA of the display panel DP may be located between the pad areas I-PA in the first direction DR1. Accordingly, the pad areas I-PA may not overlap the pad areas D-PA when viewed from above the plane.

The shielding electrodes SHE may be located over the MUX circuits MXP, respectively. For example, in FIG. 7, the shielding electrodes SHE are illustrated in gray. The shielding electrodes SHE may shield external static electricity, such that the external static electricity is not applied to the MUX circuits MXP.

In one or more embodiments, an input-sensing controller that controls an operation of the input-sensing part ISP may be connected to the pads I-PD through a printed circuit board.

The input-sensing part ISP according to one or more embodiments of the present disclosure may be driven in a self-sensing mode, and may obtain coordinate information in a self-cap type. For example, through the pads I-PD, the MUX circuits MXP, and the sensing lines SNL, the input-sensing controller may apply a driving signal to the sensing electrodes SE, and may receive a sensing signal from the sensing electrodes SE.

Figure 8:
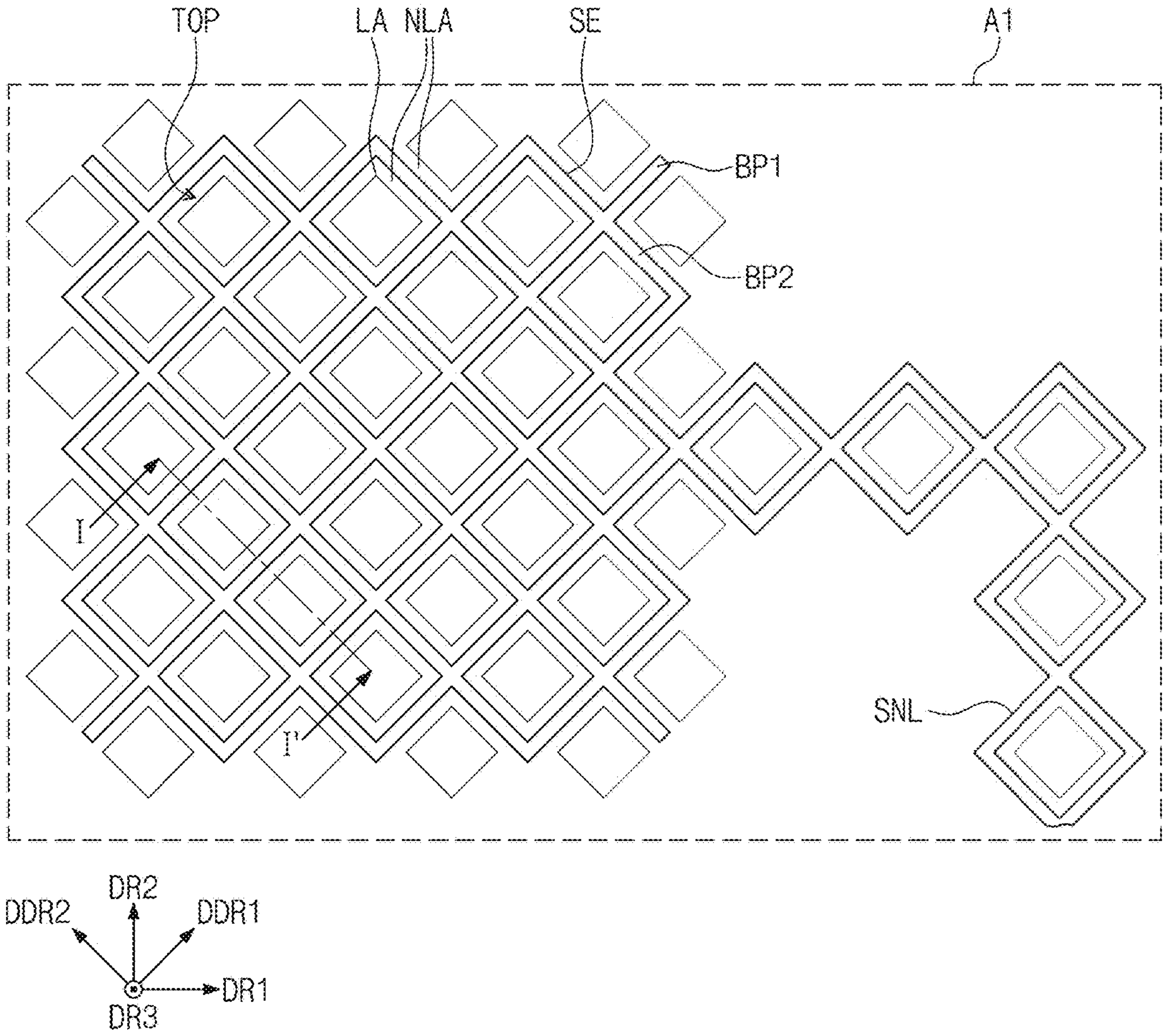
FIG. 8 is an enlarged view illustrating a detailed configuration of a sensing electrode located in a first area A1 illustrated in FIG. 7.
Figure 9:
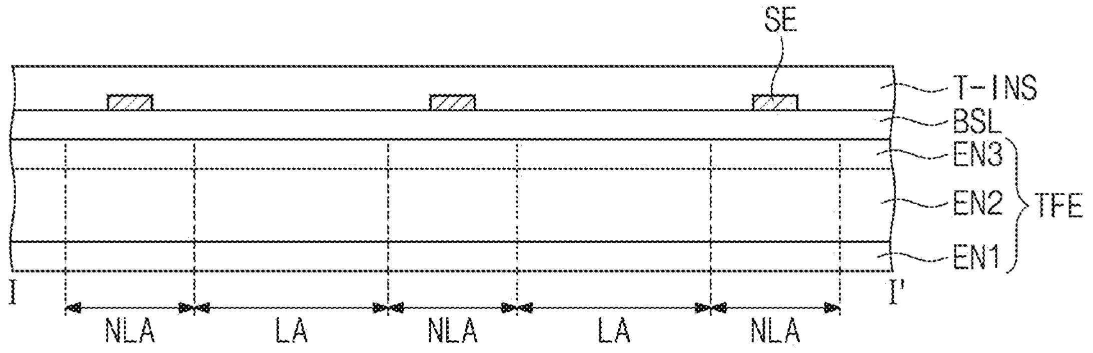
FIG. 9 is a sectional view taken along the line I-I' illustrated in FIG. 8.

FIG. 8 is an enlarged view illustrating a detailed configuration of a sensing electrode located in a first area A1 illustrated in FIG. 7. FIG. 9 is a sectional view taken along the line I-I' illustrated in FIG. 8.

In FIGS. 8 and 9, emissive areas LA and the non-emissive area NLA are illustrated together. Other sensing electrodes SE around the first area A1 illustrated in FIG. 7 may have substantially the same shape as the sensing electrode SE illustrated in FIG. 8.

Referring to FIG. 8, a sensing line SNL may extend from the sensing electrode SE. The sensing electrode SE and the sensing line SNL may be integrally formed with each other. The sensing electrode SE and the sensing line SNL may have a mesh shape. For example, the sensing electrode SE and the sensing line SNL may each include a plurality of first branch portions BP1 extending in a first diagonal direction DDR1, and a plurality of second branch portions BP2 extending in a second diagonal direction DDR2.

The first diagonal direction DDR1 may be defined as a direction crossing the first and second directions DR1 and DR2 on the plane defined by the first and second directions DR1 and DR2. The second diagonal direction DDR2 may be defined as a direction crossing the first diagonal direction DDR1 on the plane defined by the first and second directions DR1 and DR2. For example, the first direction DR1 and the second direction DR2 may cross each other at a right angle, and the first diagonal direction DDR1 and the second diagonal direction DDR2 may cross each other at a right angle.

The first branch portions BP1 and the second branch portions BP2 may cross each other, and may be integrally formed with each other. Openings TOP having a rhombic shape may be defined by the first branch portions BP1 and the second branch portions BP2 crossing each other. The first and second branch portions BP1 and BP2 may be defined as mesh lines, and each of the mesh lines may have a line width of several micrometers. The first and second branch portions BP1 and BP2 may include metal.

The emissive areas LA may have a rhombic shape, and may be located to overlap the openings TOP. The first and second branch portions BP1 and BP2 may be located to overlap the non-emissive area NLA. The emissive area LA illustrated in FIG. 6 may be one of the emissive areas LA illustrated in FIG. 7.

Because the first and second branch portions BP1 and BP2 are located in the non-emissive area NLA, light generated from the emissive areas LA may be normally output without being affected by the first and second branch portions BP1 and BP2.

Referring to FIG. 9, a base layer BSL may be located on the thin film encapsulation layer TFE. The base layer BSL may include an inorganic insulating layer. The sensing electrode SE may be located on the base layer BSL. The sensing electrode SE may be located to overlap the non-emissive area NLA. An insulating layer T-INS may be located on the base layer BSL to cover the sensing electrode SE. The insulating layer T-INS may include an inorganic insulating layer or an organic insulating layer.

Figure 10:
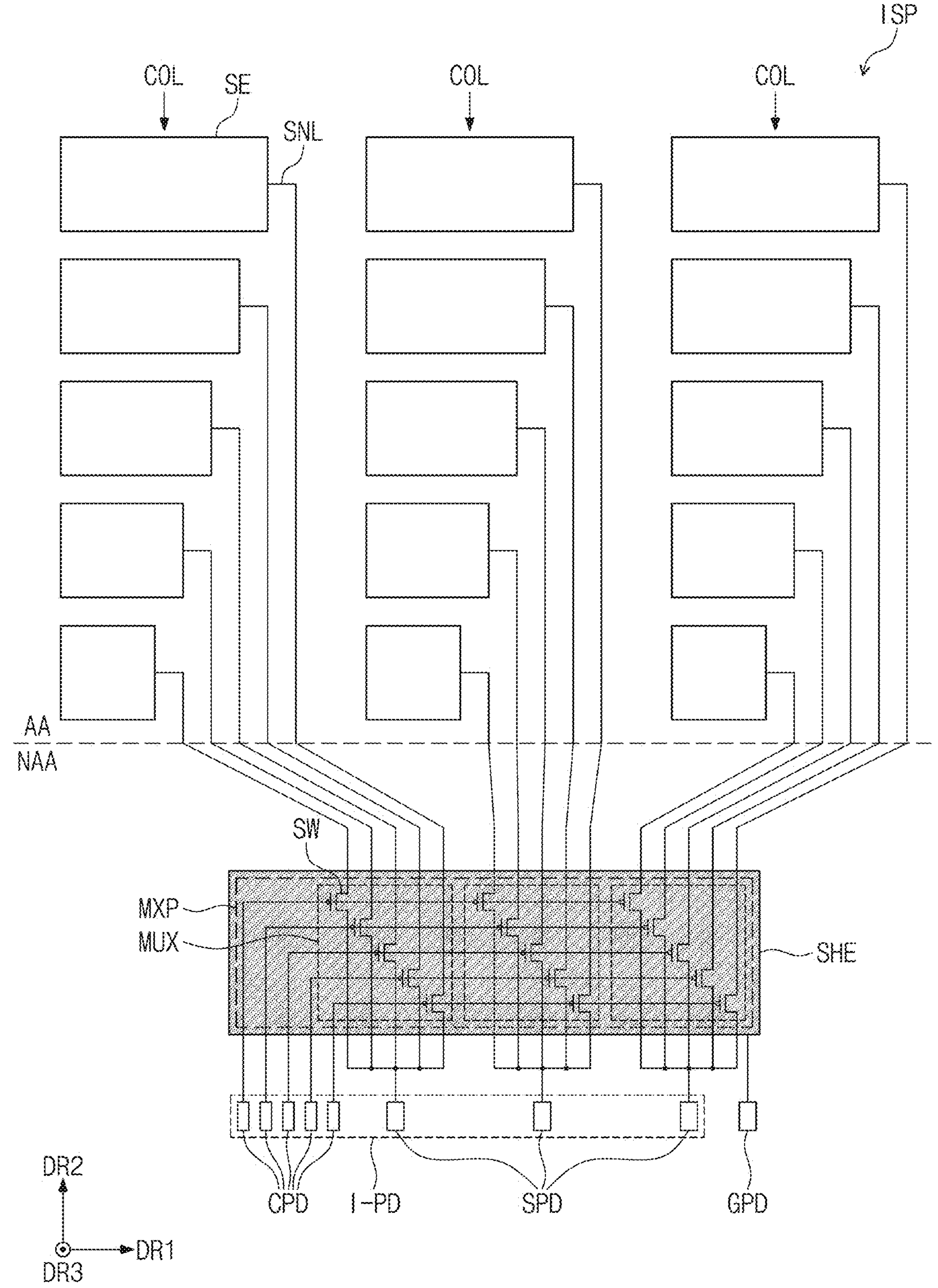
FIG. 10 is a view illustrating a configuration of one MUX circuit illustrated in FIG. 8, and sensing electrodes and pads connected to the one MUX circuit.

FIG. 10 is a view illustrating a configuration of one MUX circuit illustrated in FIG. 8, and sensing electrodes and pads connected to the one MUX circuit.

Referring to FIG. 10, the MUX circuit may include a plurality of MUX circuits MUX. The MUX circuits MUX may be arranged in the first direction DR1. The sensing electrodes SE may be arranged in a plurality of columns COL, and the MUX circuits MUX may be located to correspond to the columns COL, respectively.

The MUX circuits MUX may be connected to the sensing electrodes SE. Each of the MUX circuits MUX may be connected to the sensing electrodes SE arranged in a corresponding column COL among the columns COL. For example, the h-th MUX circuit MUX may be connected to the sensing electrodes SE arranged in the h-th column. The h-th column COL may indicate one column among the columns COL illustrated in FIG. 10.

The MUX circuits MUX may be connected to sensing lines SNL. The MUX circuits MUX may be connected to the sensing electrodes SE through the sensing lines SNL. The h-th MUX circuit MUX may be connected to the sensing lines SNL connected to the sensing electrodes SE arranged in the h-th column COL.

The pads I-PD may include a plurality of sensing pads SPD and a plurality of control pads CPD. Although omitted in FIG. 7 for convenience of description, the input-sensing part ISP may further include a ground pad GPD as illustrated in FIG. 10.

The sensing pads SPD, the control pads CPD, and the ground pad GPD may be arranged in the first direction DR1. The sensing pads SPD may be located between the control pads CPD and the ground pad GPD.

The sensing pads SPD may be arranged in the first direction DR1. The number of sensing pads SPD may be less than the number of sensing lines SNL. The sensing pads SPD may be connected to the MUX circuits MUX, respectively. The h-th MUX circuit MUX may connect the sensing lines SNL connected to the sensing electrodes SE located in the h-th column COL to the h-th sensing pad SPD.

Each of the MUX circuits MUX may include a plurality of switching elements SW. The switching elements SW of the h-th MUX circuit MUX may be connected to the sensing lines SNL connected to the sensing electrodes SE in the h-th column COL, respectively. The switching elements SW of the h-th MUX circuit MUX may be commonly connected to the h-th sensing pad SPD. The switching elements SW of the h-th MUX circuit MUX may be turned on at different timings.

First terminals of the switching elements SW of the h-th MUX circuit MUX may be connected to the sensing lines SNL connected to the sensing electrodes SE in the h-th column COL, respectively. Second terminals of the switching elements SW of the h-th MUX circuit MUX may be commonly connected to the h-th sensing pad SPD. The first and second terminals may be defined as input and output terminals.

Control terminals of the switching elements SW of the h-th MUX circuit MUX may be connected to the control pads CPD, respectively. Control signals received through the control pads CPD may be provided to the control terminals of the switching elements SW, and the switching elements SW may be turned on or off.

The switching elements SW of the h-th MUX circuit MUX may selectively connect the h-th sensing pad SPD to the sensing lines SNL connected to the sensing electrodes SE located in the h-th column COL.

A shielding electrode SHE may be located over the MUX circuits MUX, and may cover the MUX circuits MUX. The shielding electrode SHE may be implemented with a quadrangular electrode having a one-body shape, and may cover all of the MUX circuits MUX. For example, the shielding electrode SHE may be located over the switching elements SW, and may cover all of the switching elements SW.

In FIG. 10, the shape of the shielding electrode SHE is illustrated as an example, and the shielding electrode SHE may have various shapes other than the quadrangular shape. The shielding electrode SHE may extend longer in the first direction DR1 than in the second direction DR2.

The shielding electrode SHE may be connected to the ground pad GPD. In one or more embodiments, the ground pad GPD may be connected to a ground terminal of the display device DD. The shielding electrode SHE may shield external static electricity, such that the external static electricity is not applied to the MUX circuits MUX. The external static electricity may be discharged through the ground pad GPD.

The MUX circuits MUX may be protected from the external static electricity by the shielding electrode SHE. Accordingly, the switching elements SW of the MUX circuits MUX may not be damaged by the external static electricity.

Figure 11:
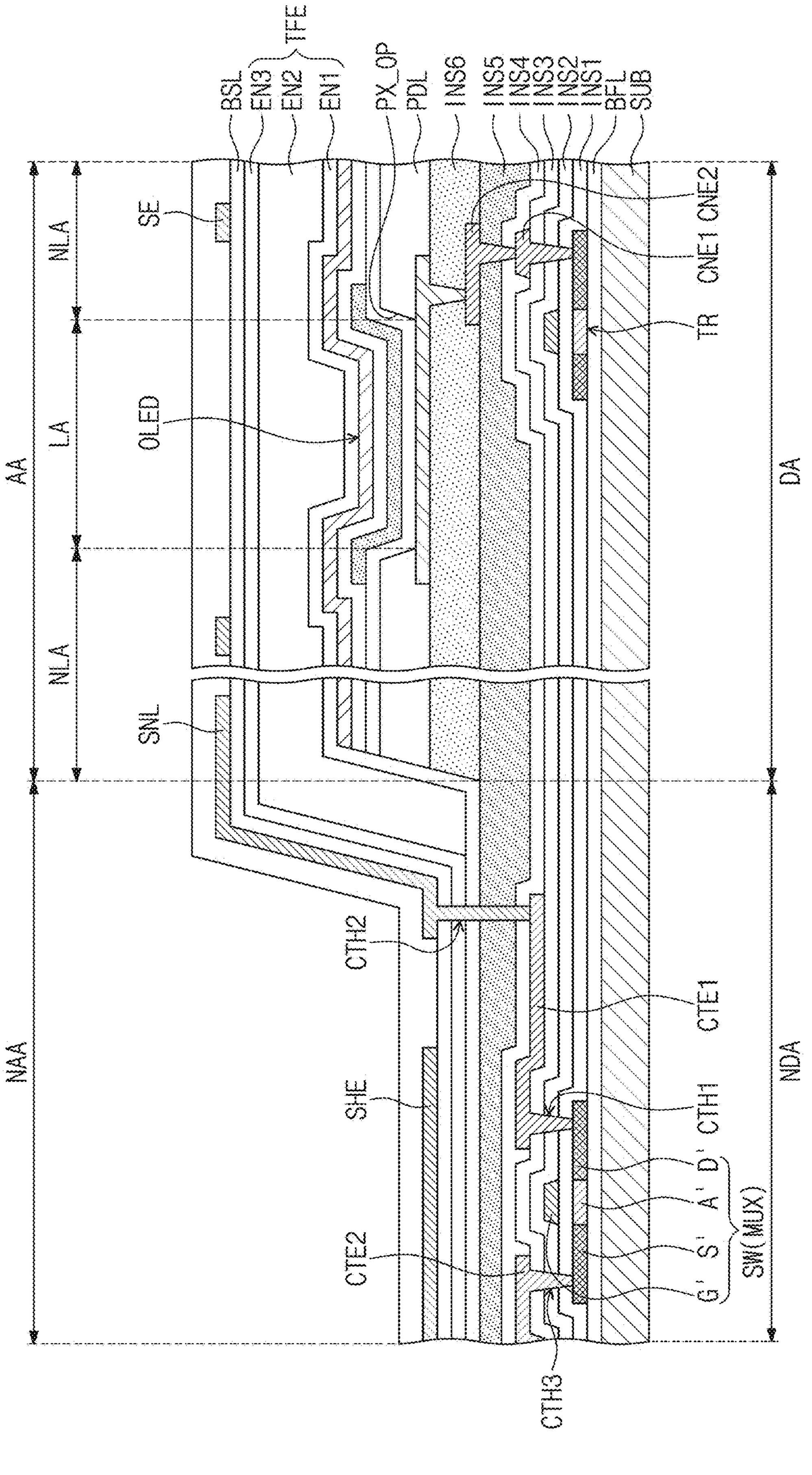
FIG. 11 is a schematic sectional view illustrating a portion of the input-sensing part corresponding to one pixel, and a portion of the input-sensing part corresponding to one switching element in FIG. 10.

FIG. 11 is a schematic sectional view illustrating a portion of the input-sensing part corresponding to one pixel, and a portion of the input-sensing part corresponding to one switching element in FIG. 10.

In FIG. 11, a section of the display panel DP is illustrated together with a section of the input-sensing part ISP.

Referring to FIG. 11, the buffer layer BFL and the first to fifth insulating layers INS1 to INS5 may extend to the non-display area NDA. The sixth insulating layer INS6 and the pixel-defining layer PDL may be located in the display area DA, and may be omitted from the non-display area NDA.

The first and third encapsulation layers EN1 and EN3 may extend to the non-display area NDA. The second encapsulation layer EN2 may extend to a portion of the non-display area NDA that is adjacent to the display area DA.

A sensing electrode SE and a sensing line SNL may be located on the same layer. For example, the sensing electrode SE and the sensing line SNL may be located on the base layer BSL. A shielding electrode SHE may be located on the same layer as the sensing electrode SE and the sensing line SNL. For example, the shielding electrode SHE may be located on the base layer BSL.

Accordingly, the sensing electrodes SE, the sensing lines SNL, and the shielding electrodes SHE illustrated in FIG. 7 may be provided as a single layer on the base layer BSL, and may be located on the same layer. The sensing electrodes SE, the sensing lines SNL, and the shielding electrodes SHE may be concurrently or substantially simultaneously subjected to patterning with the same material.

A switching element SW of a MUX circuit MUX, which is a component of the input-sensing part ISP, may be located inside the display panel DP. Accordingly, the above-described MUX circuits MUX may be located inside the display panel DP, and may be located below the sensing electrodes SE, the sensing lines SNL, and the shielding electrodes SHE.

The switching element SW may be located on the substrate SUB. The switching element SW may have substantially the same configuration as the transistor TR. The switching element SW may be located on the same layer as the transistor TR. Like the transistor TR, the switching element SW may include a source S', an active area A', a drain D', and a gate G'. The gate electrode G' may correspond to a control terminal of the switching element SW, the drain D' may correspond to a first terminal of the switching element SW, and the source S' may correspond to a second terminal of the switching element SW.

The sensing line SNL may extend to the non-active area NAA, and may be connected to the switching element SW. The switching element SW may be connected to the sensing line SNL through a first connecting electrode CTE1.

The first connecting electrode CTE1 may be located on the same layer as the first connecting electrode CNE1. For example, the first connecting electrode CTE1 may be located on the third insulating layer INS3, and the fourth insulating layer INS4 may be located on the first connecting electrode CTE1 and the third insulating layer INS3. The first connecting electrode CTE1 and the first connecting electrode CNE1 may be concurrently or substantially simultaneously subjected to patterning with the same material.

The first connecting electrode CTE1 may be connected to the drain D' of the switching element SW through a first contact hole CTH1 defined in the first to third insulating layers INS1 to INS3. The sensing line SNL may be connected to the first connecting electrode CTE1 through a second contact hole CTH2 that is defined in the fourth and fifth insulating layers INS4 and INS5, the first and third encapsulation layers EN1 and EN3, and the base layer BSL in the non-active area NAA.

A second connecting electrode CTE2 may be located over the switching element SW. The second connecting electrode CTE2 may be located on the same layer as the first connecting electrode CTE1. For example, the second connecting electrode CTE2 may be located on the third insulating layer INS3, and the fourth insulating layer INS4 may be located on the second connecting electrode CTE2 and the third insulating layer INS3. The second connecting electrode CTE2 and the first connecting electrode CTE1 may be concurrently or substantially simultaneously subjected to patterning with the same material.

The second connecting electrode CTE2 may be connected to the source S' of the switching element SW through a third contact hole CTH3 defined in the first to third insulating layers INS1 to INS3. In one or more embodiments, the second connecting electrode CTE2 may be connected to a corresponding sensing pad SPD.

In one or more embodiments of the present disclosure, the shielding electrode SHE may be located over the switching element SW, and may cover the switching element SW. Accordingly, the shielding electrode SHE may shield external static electricity, such that the external static electricity is not applied to the switching element SW. Thus, damage to the switching element SW may be reduced or prevented.

FIGS. 12 to 16 are views illustrating configurations of shielding electrodes according to various embodiments of the present disclosure.

FIGS. 12 to 16 are plan views corresponding to FIG. 10. Hereinafter, the configurations illustrated in FIGS. 12 to 16 will be described focusing on the differences from the configuration illustrated in FIG. 10.

Figure 12:
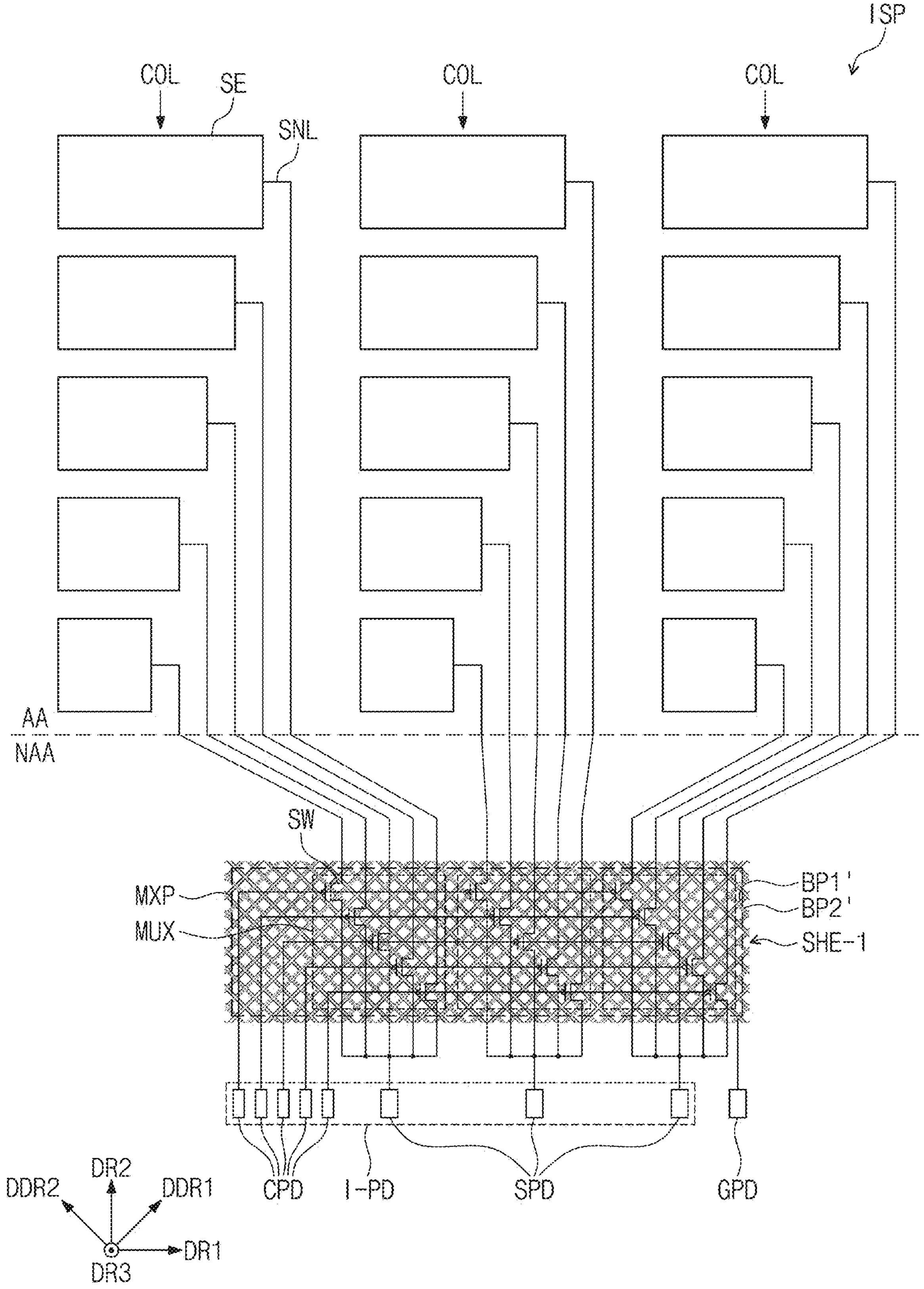
FIGS. 12 to 16 are views illustrating configurations of shielding electrodes according to various embodiments of the present disclosure.

Referring to FIG. 12, a shielding electrode SHE-1 may be located over the MUX circuits MUX. The shielding electrode SHE-1 may have a mesh shape. For example, the shielding electrode SHE-1 may include a plurality of first branch portions BP1' extending in the first diagonal direction DDR1, and a plurality of second branch portions BP2' extending in the second diagonal direction DDR2. The first branch portions BP1' and the second branch portions BP2' may cross each other, and may be integrally formed with each other.

Figure 13:
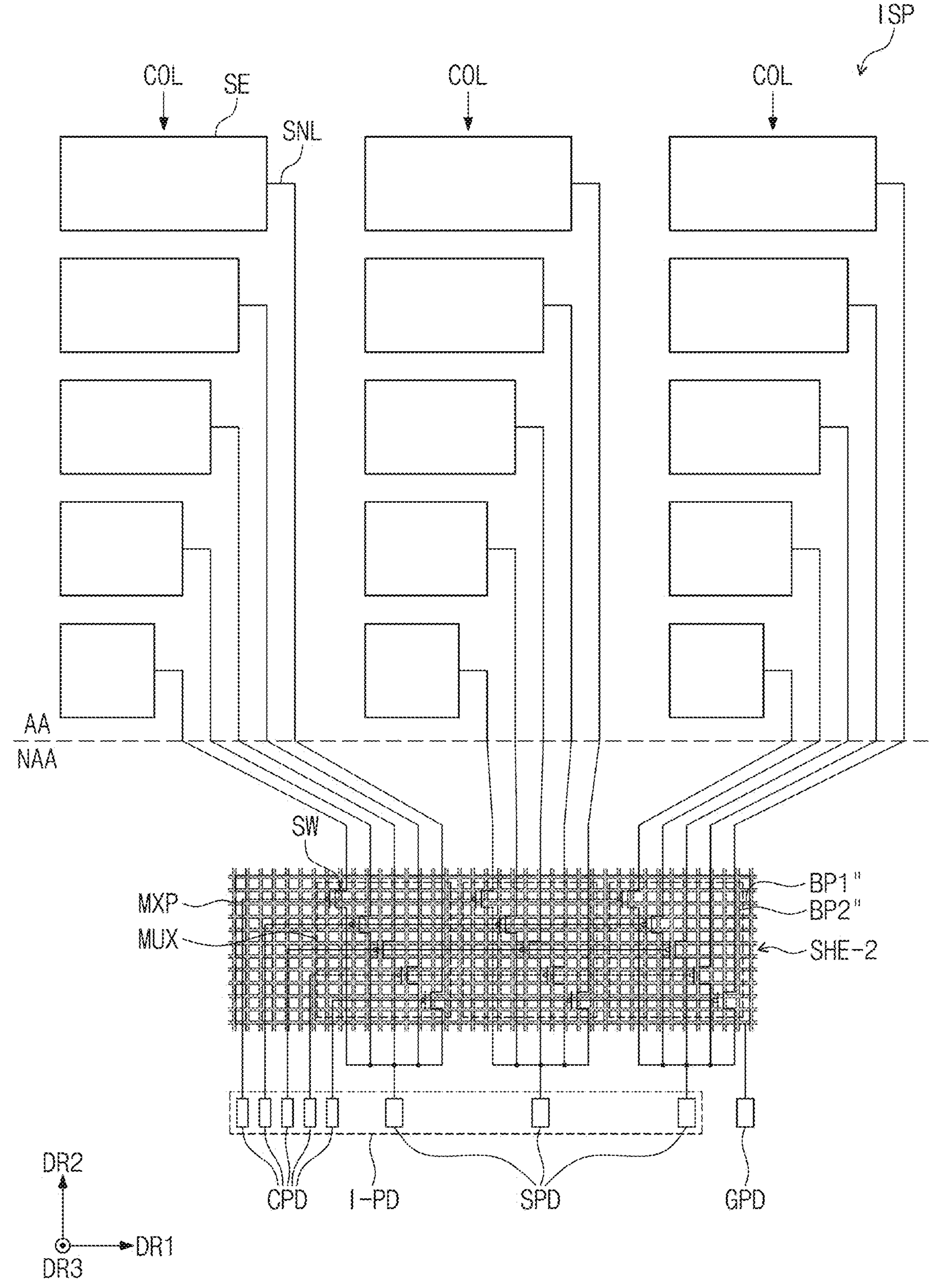

Referring to FIG. 13, a shielding electrode SHE-2 may be located over the MUX circuits MUX. The shielding electrode SHE-2 may have a mesh shape. For example, the shielding electrode SHE-2 may include a plurality of first branch portions BP1" extending in the first direction DR1, and a plurality of second branch portions BP2" extending in the second direction DR2. The first branch portions BP1" and the second branch portions BP2" may cross each other, and may be integrally formed with each other.

Figure 14:
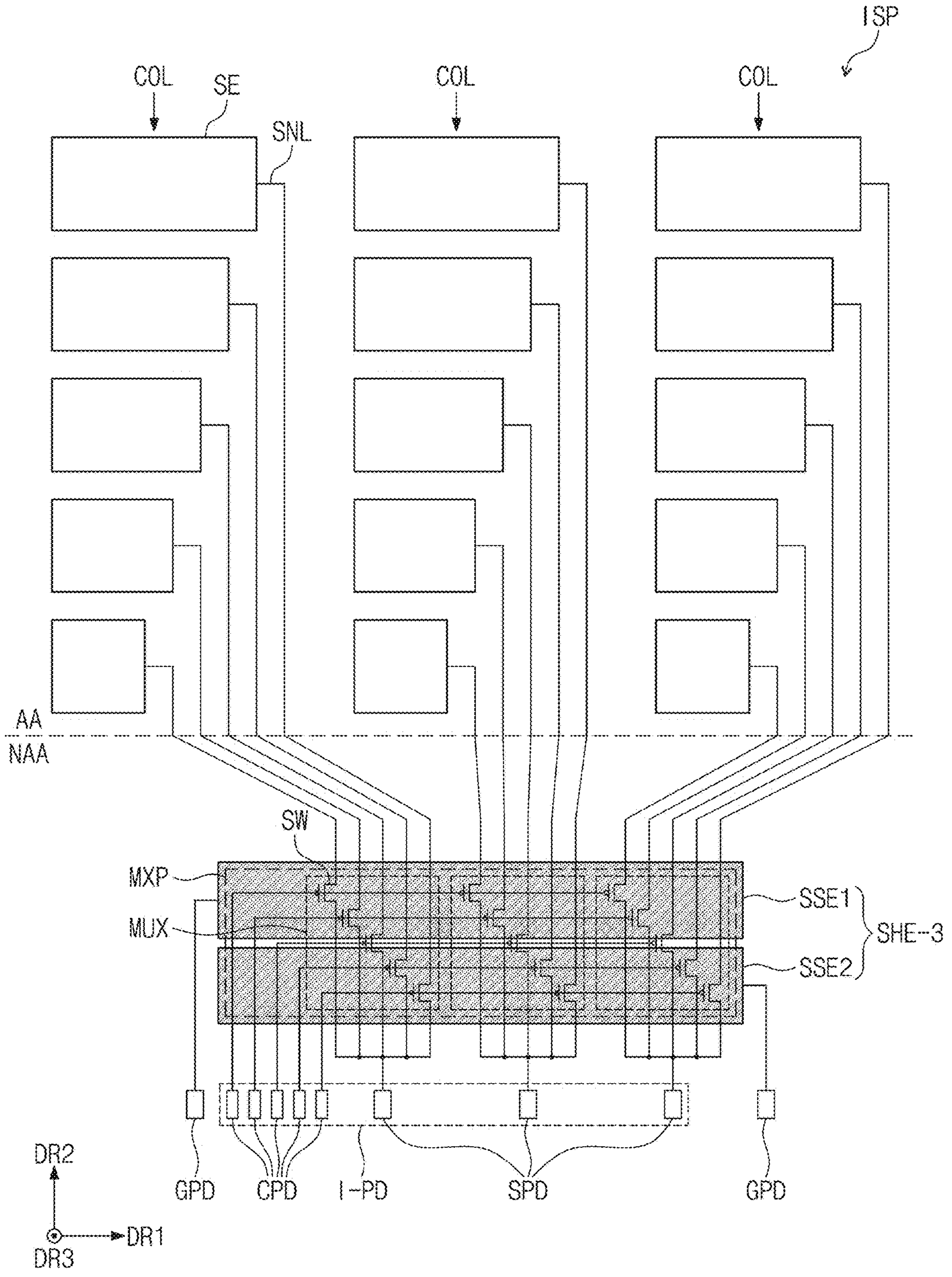

Referring to FIG. 14, a shielding electrode SHE-3 may include a first sub-shielding electrode SSE1, and a second sub-shielding electrode SSE2 spaced apart from the first sub-shielding electrode SSE1 in the second direction DR2. Ground pads GPD may be connected to the first sub-shielding electrode SSE1 and the second sub-shielding electrode SSE2, respectively.

Figure 15:
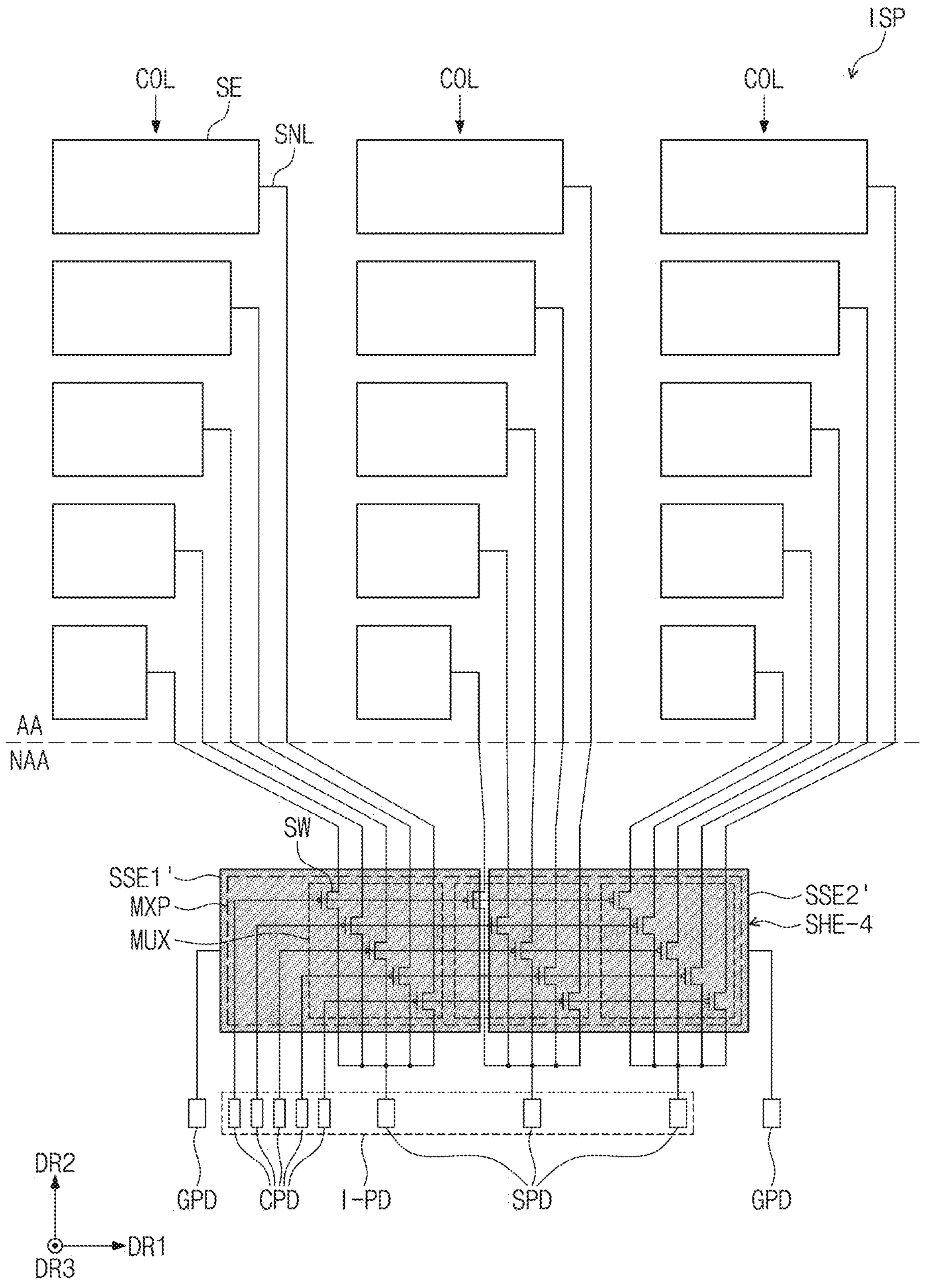

Referring to FIG. 15, a shielding electrode SHE-4 may include a first sub-shielding electrode SSE1', and a second sub-shielding electrode SSE2' spaced apart from the first sub-shielding electrode SSE1' in the first direction DR1. Ground pads GPD may be connected to the first sub-shielding electrode SSE1' and the second sub-shielding electrode SSE2', respectively.

Figure 16:
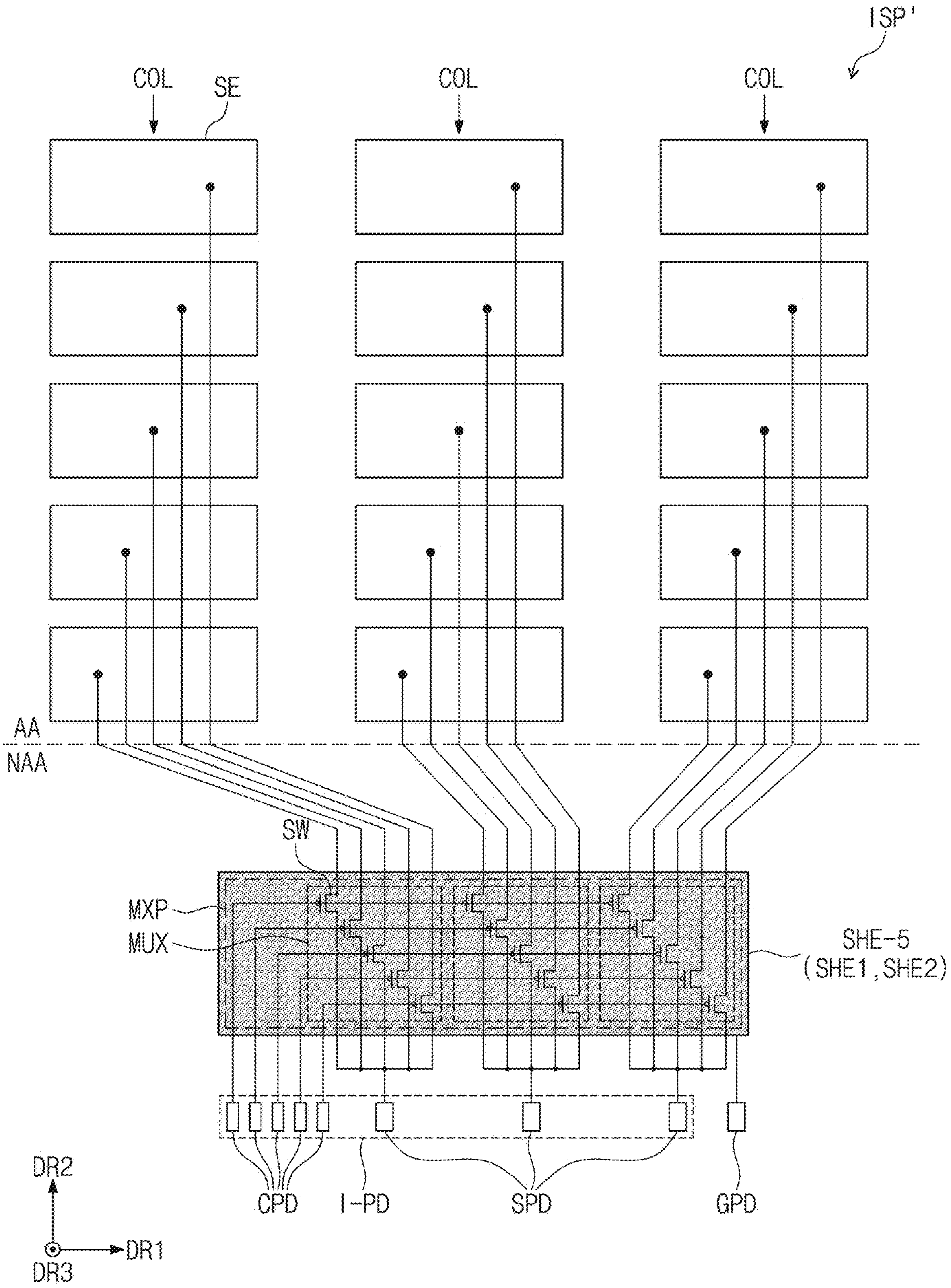

Referring to FIG. 16, the sensing lines SNL may be located on a layer that is different from the layer on which the sensing electrodes SE are located, and may be connected to the sensing electrodes SE. For example, the sensing lines SNL may be located below the sensing electrodes SE, and may be connected to the sensing electrodes SE, respectively. This stacked structure will be described below with reference to FIG. 17.

A shielding electrode SHE-5 may be located over the MUX circuits MUX, and may cover the MUX circuits MUX. The shielding electrode SHE-5 may be connected to a ground pad GPD. The shielding electrode SHE-5 may be formed of multiple layers. For example, the shielding electrode SHE-5 may include a first shielding electrode SHE1 and a second shielding electrode SHE2 located on different respective layers. This stacked structure will be described below with reference to FIG. 17.

Figure 17:
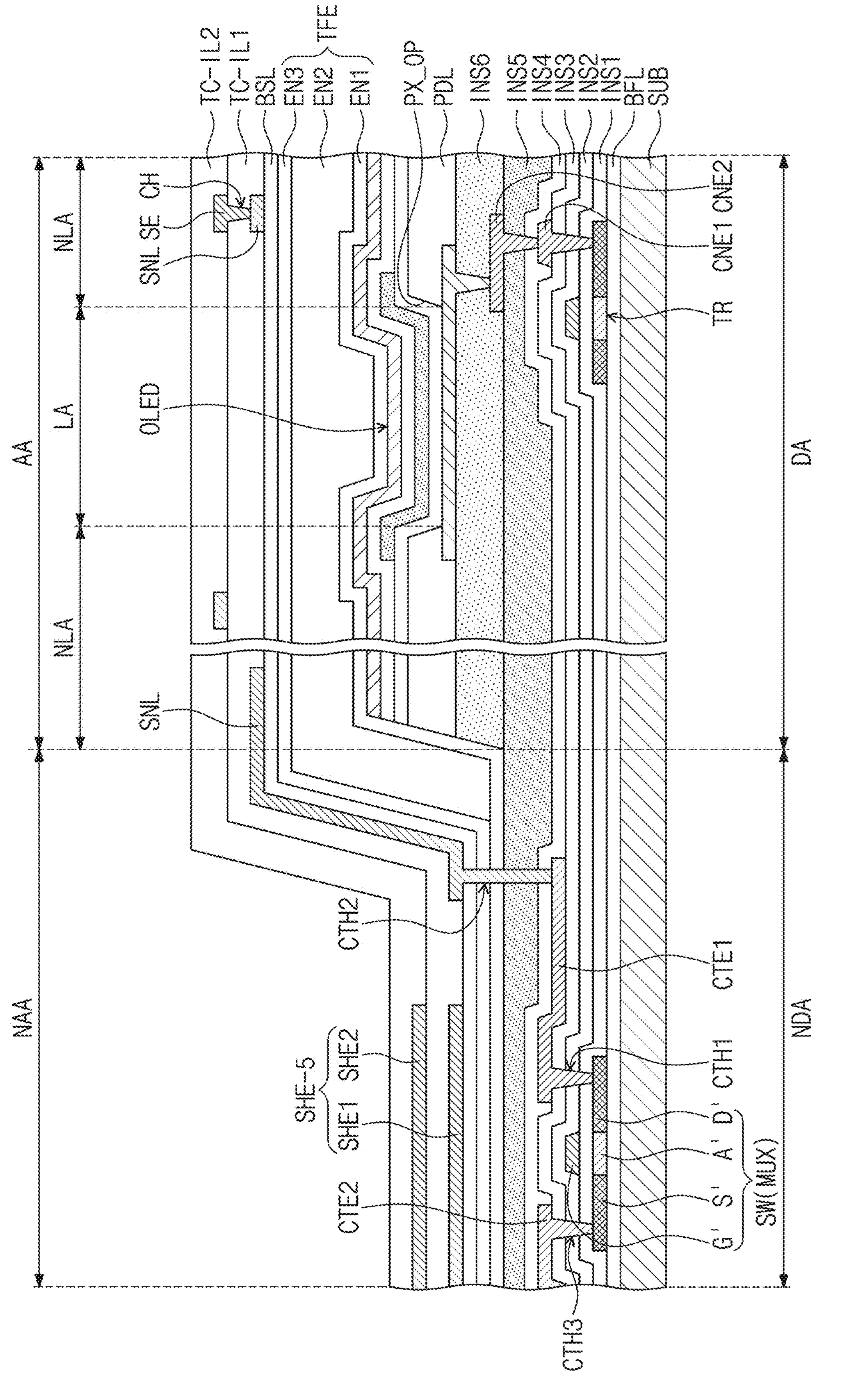
FIG. 17 is a schematic sectional view illustrating a portion of the input-sensing part corresponding to one pixel, and a portion of the input-sensing part corresponding to one switching element in FIG. 16.

FIG. 17 is a schematic sectional view illustrating a portion of the input-sensing part corresponding to one pixel, and a portion of the input-sensing part corresponding to one switching element in FIG. 16.

FIG. 17 is a sectional view corresponding to FIG. 11.

Referring to FIG. 17, a sensing line SNL may be located on the base layer BSL. The sensing line SNL may extend to the non-active area NAA. A first insulating layer TC-IL1 may be located on the base layer BSL to cover the sensing line SNL. The first insulating layer TC-IL1 may include an inorganic insulating layer or an organic insulating layer.

A sensing electrode SE may be located on the first insulating layer TC-IL1. The sensing electrode SE may be located above the sensing line SNL. The sensing electrode SE may be connected to the sensing line SNL through a contact hole CH defined in the first insulating layer TC-IL1. A second insulating layer TC-IL2 may be located on the first insulating layer TC-IL1 to cover the sensing electrode SE. The second insulating layer TC-IL2 may include an organic insulating layer.

A configuration in which the sensing line SNL extending to the non-active area NAA is connected to a switching element SW may be the same as the configuration in which the sensing line SNL is connected to the switching element SW in FIG. 11.

The first shielding electrode SHE1 may be located on the base layer BSL. The first insulating layer TC-IL1 may be located on the base layer BS to cover the first shielding electrode SHE1. The second shielding electrode SHE2 may be located on the first insulating layer TC-IL1. The second shielding electrode SHE2 may be located over the first shielding electrode SHE1. The second insulating layer TC-IL2 may be located on the first insulating layer TC-IL1 to cover the second shielding electrode SHE2.

The first shielding electrode SHE1 may be located on the same layer as the sensing line SNL. The first shielding electrode SHE1 and the sensing line SNL may be concurrently or substantially simultaneously subjected to patterning with the same material. The second shielding electrode SHE2 may be located on the same layer as the sensing electrode SE. The second shielding electrode SHE2 and the sensing electrode SE may be concurrently or substantially simultaneously subjected to patterning with the same material.

Because the second shielding electrode SHE2, together with the first shielding electrode SHE1, is located over the switching element SW, static electricity may be more suitably blocked by the first and second shielding electrodes SHE1 and SHE2.

According to the embodiments of the present disclosure, the shielding electrode may be located over the MUX circuits. The shielding electrode may cover the MUX circuits, and may protect the MUX circuits from external static electricity. Accordingly, damage to the MUX circuits may be reduced or prevented.

While the present disclosure has been described with reference to embodiments thereof, it will be apparent to those of ordinary skill in the art that various changes and modifications may be made thereto without departing from the spirit and scope of the present disclosure as set forth in the following claims, with functional equivalents thereof to be included therein.

What is claimed is:

1. An input-sensing part comprising:
sensing electrodes;
sensing lines connected to the sensing electrodes;
MUX circuits connected to the sensing lines;
sensing pads connected to the MUX circuits, the sensing pads being fewer in number than the sensing lines; and
a shielding electrode above the MUX circuits to cover the MUX circuits, and at a same layer as the sensing lines or the sensing electrodes,
wherein the MUX circuits are at a layer below the sensing electrodes, the sensing lines, and the shielding electrode.

2. The input-sensing part of claim 1, wherein the shielding electrode is at a same layer as the sensing lines.

3. The input-sensing part of claim 1, wherein the shielding electrode is at a same layer as the sensing electrodes.

4. The input-sensing part of claim 1, wherein the sensing electrodes, the sensing lines, and the shielding electrode are at a same layer.

5. The input-sensing part of claim 1, further comprising a ground pad connected to the shielding electrode.

6. The input-sensing part of claim 1, wherein the shielding electrode is configured to shield the MUX circuits from an external static electricity.

7. The input-sensing part of claim 1, wherein the shielding electrode comprises a one-body shape to cover all of the MUX circuits.

8. The input-sensing part of claim 1, wherein the sensing electrodes are arranged in a first direction, and in a second direction crossing the first direction,
wherein the MUX circuits are arranged in the first direction, and
wherein an h-th MUX circuit connects ones of the sensing lines connected to ones of the sensing electrodes in an h-th column to an h-th one of the sensing pads, h being a natural number.

9. The input-sensing part of claim 8, wherein a length of the shielding electrode is greater in the first direction than in the second direction.

10. The input-sensing part of claim 8, wherein the h-th MUX circuit comprises switching elements connected to the ones of the sensing lines connected to the ones of the sensing electrodes in the h-th column, respectively, the switching elements being commonly connected to the h-th one of the sensing pads, and being configured to be turned on at different respective timings by control signals.

11. The input-sensing part of claim 10, wherein the shielding electrode is above the switching elements to cover the switching elements.

12. The input-sensing part of claim 8, wherein the shielding electrode comprises:
a first sub-shielding electrode; and
a second sub-shielding electrode spaced apart from the first sub-shielding electrode in the second direction.

13. The input-sensing part of claim 8, wherein the shielding electrode comprises:
a first sub-shielding electrode; and
a second sub-shielding electrode spaced apart from the first sub-shielding electrode in the first direction.

14. The input-sensing part of claim 1, wherein the shielding electrode has a mesh shape.

15. The input-sensing part of claim 1, wherein the shielding electrode comprises:
a first shielding electrode; and
a second shielding electrode above the first shielding electrode.

16. An input-sensing part comprising:
sensing electrodes;
sensing lines connected to the sensing electrodes;
MUX circuits connected to the sensing lines;
sensing pads connected to the MUX circuits, the sensing pads being fewer in number than the sensing lines; and
a shielding electrode above the MUX circuits to cover the MUX circuits and comprising a first shielding electrode, and a second shielding electrode above the first shielding electrode,
wherein the sensing electrodes are above the sensing lines,
wherein the first shielding electrode is at a same layer as the sensing lines, and
wherein the second shielding electrode is at a same layer as the sensing electrodes.

17. A display device comprising:
a display panel comprising light-emitting elements, and transistors connected to the light-emitting elements; and
an input-sensing part above the display panel, the input-sensing part comprising:
sensing electrodes;
sensing lines connected to the sensing electrodes;
MUX circuits connected to the sensing lines, and comprising switching elements at a same layer as the transistors;
sensing pads connected to the MUX circuits, the sensing pads being fewer in number than the sensing lines; and
a shielding electrode above the MUX circuits to cover the MUX circuits.

18. The display device of claim 17, wherein the MUX circuits are inside the display panel.

19. The display device of claim 17, wherein the shielding electrode is at a same layer as the sensing electrodes or as the sensing lines.

20. An electronic device comprising a display device providing an image, wherein the display device comprises:

a display panel comprising light-emitting elements, and transistors connected to the light-emitting elements; and an input-sensing part above the display panel, the input-sensing part comprising:

sensing electrodes;

sensing lines connected to the sensing electrodes;

MUX circuits connected to the sensing lines, and comprising switching elements at a same layer as the transistors;

sensing pads connected to the MUX circuits, the sensing pads being fewer in number than the sensing lines; and a shielding electrode above the MUX circuits to cover the MUX circuits.

* * * * *